United States Patent [19]

Sato

[11] 3,940,714

[45] Feb. 24, 1976

[54] AFC CIRCUIT WITH IMPROVED SENSITIVITY

[75] Inventor: Shoji Sato, Soma, Japan

[73] Assignee: Alps Electric Co., Ltd., Tokyo, Japan

[22] Filed: Nov. 21, 1974

[21] Appl. No.: 525,869

[30] Foreign Application Priority Data

Dec. 27, 1973 Japan............................ 49-4915[U]

[52] U.S. Cl............. 331/117 R; 331/177 V; 334/15
[51] Int. Cl.²........................................... H03B 5/12
[58] Field of Search.......... 331/36 C, 117 R, 177 V; 334/15; 325/420, 459

[56] References Cited
UNITED STATES PATENTS 3,825,858   7/1974   Amemiya et al................ 331/117 R Primary Examiner—Siegfried H. Grimm

[57] ABSTRACT

An AFC circuit has a tuning circuit including a first variable capacitance element and a pair of series connected inductive elements. Switch means are connected between ground and a point between the inductive elements for alternatively operably connecting one or both of the inductive elements in parallel with the first variable capacitance element to switch the tuning circuit between a higher frequency range and a lower frequency range. The AFC portion of the circuit comprises a second variable capacitance element which is connected in parallel with the first variable capacitance element. In order to improve the sensitivity of this circuit, a means is provided for capacitively coupling the second variable capacitance element to a point between the inductive elements. As a result, substantially equal AFC ranges are obtained whether the circuit is tuned to the higher or the lower frequency range.

1 Claim, 5 Drawing Figures

AFC CIRCUIT WITH IMPROVED SENSITIVITY

The present invention relates to AFC circuits and in particular to an AFC circuit wherein the sensitivity is significantly improved by equalizing the controllable frequency range of the AFC function when the circuit is tuned to the higher or lower frequency range.

A conventional AFC circuit has a tuning circuit including a variable capacitance element and a pair of series connected inductive elements. Switch means are connected between ground and the junction between the inductance elements and are effective to alternately operatively connect one or both of the inductance elements in parallel with the variable capacitance element. In this manner, the frequency range of the tuning circuit can be switched between a higher frequency band and a lower frequency band. The AFC portion of the circuit comprises a second variable capacitance element connected in parallel with the variable capacitance element element of the tuning circuit. The second variable capacitance element is controlled by the output of the AFC detecting circuit to regulate the AFC function in accordance with variations in an intermediate frequency signal derived from another part of the receiver.

This type of AFC circuit has a substantial disadvantage in that the sensitivity of the AFC circuit varies in accordance with the frequency range selected. When the AFC circuit has been adjusted to provide an acceptable controllable frequency range in the low frequency range of the circuit, the controllable frequency range of the circuit in the high frequency range becomes excessively broad. As a result, adjacent channels may be received along with the desired channel. On the other hand, when the AFC circuit is tuned to provide an accepted controllable frequency range in the high frequency range, the controllable frequency range of the AFC circuit in the lower frequency range becomes unduly narrow resulting in the ineffective operation of the AFC circuit.

It is, therefore, a prime object of the present invention to provide an AFC circuit with improved sensitivity.

It is another object of the present invention to provide an AFC circuit wherein the controllable frequency range remains substantially unchanged as the circuit is switched between the higher frequency range and the lower frequency range.

It is a further object of the present invention to provide an AFC tuning circuit which demonstrates stability of operation and is economical to manufacture.

In accordance with the present invention, an AFC circuit is provided having a tuning circuit including a first variable capacitance element and a pair of series connected inductive elements. Switch means are provided for alternately operably connecting one or both of the inductive elements in parallel with the first capacitance element to change the frequency range of the circuit between a higher and a lower frequency range. The AFC portion of the circuit comprises a second variable capacitance element connected in parallel with the first variable capacitance element. The capacitance of this element is controlled in accordance with the output of the AFC detecting circuit. The improved sensitivity of this circuit is achieved through the use of a capacitor coupling one terminal of the second variable capacitance element to a point between the inductive elements such that the controllable frequency range of the circuit remains substantially unchanged whether the circuit is tuned to the higher or lower frequency range.

To the accomplishment of the above and to such other objects as may hereinafter appear, the present invention relates to an AFC circuit having improved sensitivity as defined in the appended claims and as described in the specification, taken together with the accompanying drawings in which:

Figure 1:
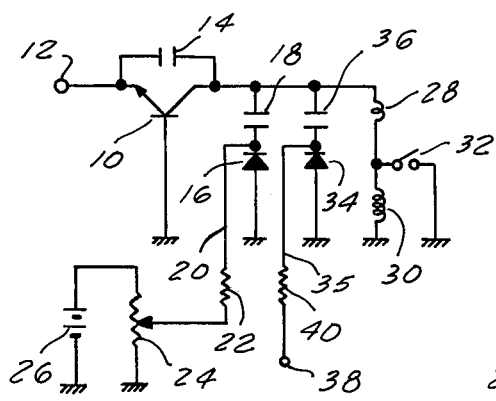
FIG. 1 is a schematic diagram of a conventional AFC circuit.

FIG. 1 shows a schematic diagram of a conventional AFC circuit. This circuit comprises a transistor 10 having a grounded control terminal and an output circuit connected between circuit output node 12 and the tuning portion of the circuit. A capacitor 14 is connected in parallel to the output circuit of transistor 10. A first variable capacitance element preferably in the form of a tuning varactor 16 is connected in series with a direct current blocking capacitor 18 between the collector of transistor 10 and ground. The capacitance of varactor 16 is controlled by the voltage on line 20 which is connected by means of resistor 22 to the output of a potentiometer 24. Potentiometer 24 is connected to a voltage source represented herein as a battery 26. A pair of series connected inductance elements in the form of inductor coils 28 and 30 are connected between ground and the collector of transistor 10. A switch 32 is connected between ground and the junction of coils 28 and 30. Switch 32 serves to switch the tuning circuit between the high frequency range and the low frequency range. A second variable capacitance element 34, also in the form of a varactor, is connected in series with the second DC blocking capacitor 36 between ground and the collector of transistor 10. The voltage on a line 35, connected to one terminal of varactor 34, controls the value of the capacitance of varactor 34 in accordance with the output of the AFC detecting circuit which appears on node 38 and which, by means of resistor 40, is connected to line 35.

In the above-described AFC circuit, a local oscillation frequency $f$ can be expressed as $$f = \frac{1}{2\pi\sqrt{LC}} \qquad (1)$$

and a frequency deviation $\Delta f$ corresponding to a small variation $\Delta C$ in the capacitance $C$ is expressed as follows:

$$\frac{\Delta f}{\Delta C} = \frac{-f}{2C}$$

$$\Delta f = \frac{f}{2C} \Delta C . \qquad (2)$$

Designating the local oscillation frequency for the higher frequency range as $f_1$; the tuning capacitance of the local oscillation circuit in the high range as $C_1$; a small frequency deviation in the local oscillation frequency in the high range as $\Delta f_1$; the local oscillation frequency for the lower frequency range as $f_2$; the tuning capacitance of the local oscillation circuit in the low range as $C_2$, and a small frequency deviation in the local oscillation frequency in the low range as $\Delta f_2$, the AFC sensitivity ratio can be expressed as $$\frac{\Delta f_1}{\Delta f_2} = \frac{C_2 f_1}{C_1 f_2}. \quad (3)$$

From this relation, it can be seen that if the AFC sensitivity ratio is selected to have an acceptable value and the AFC sensitivity in the lower frequency range is selected to have an adequate value, the AFC sensitivity in the higher frequency range will be excessively wide resulting in erroneous operation wherein channels adjacent the desired channel will also be received. On the other hand, when the AFC sensitivity in the higher frequency range is selected to an adequate value under the same conditions, the AFC sensitivity in the lower frequency range becomes too narrow resulting in completely insufficient AFC operation.

Figure 2:
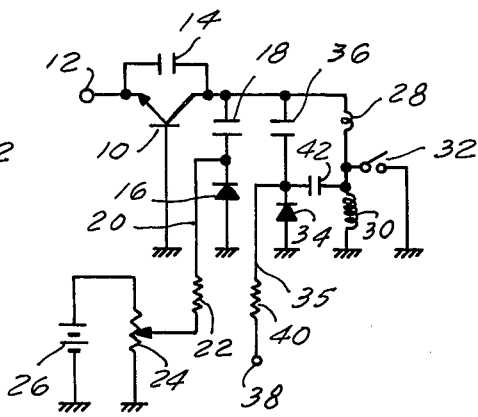
FIG. 2 is a schematic diagram of a first preferred embodiment of the present invention.

FIG. 2 shows a schematic diagram of a first preferred embodiment of the present invention which is designed to overcome the above-mentioned disadvantage. This circuit has the same components as the circuit shown in FIG. 1 with the exception that a means for capacitively coupling the second variable capacitance element 34 with the junction between the inductance elements 28 and 30 is provided. This element is in the form of a capacitor 42. Capacitive coupling of the second variable capacitance element with the junction of the inductance coils results in a widening of the controllable frequency range when the circuit is operated in the lower frequency range and a narrowing of the controllable frequency range when the circuit is operated in the higher frequency range. Thus, the controllable frequency range in the AFC circuit can be maintained at substantially equal levels whether the circuit is operated in a higher frequency range or in the lower frequency range.

Figure 3:
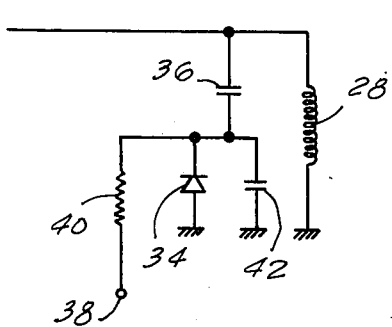
FIG. 3 is a schematic diagram of a circuit equivalent to a portion of the AFC circuit shown in FIG. 2 when the AFC circuit is operated in the higher frequency range.

When a channel in the higher frequency range is received by the circuit, the switch 32 will be closed thereby short-circuiting coil 30. In this state the pertinent portion of the AFC circuit is equivalent to the circuit shown in FIG. 3. Letting the capacitance of the second capacitance tuning element be $C_1$ and the capacitances of capacitors 36 and 42 be $C_2$ and $C_3$ respectively, the tuning capacitance $C_{T1}$ can be expressed as:

$$C_{T1} = \frac{C_2 \cdot (C_1 + C_3)}{C_1 + C_2 + C_3}. \quad (4)$$

Figure 4:
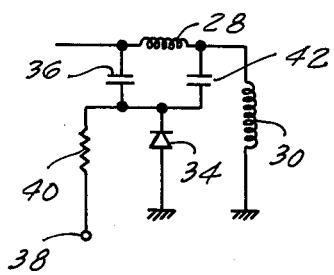
FIG. 4 is a schematic diagram of a circuit equivalent to a portion of the AFC circuit shown in FIG. 2 but wherein the circuit is operated in the lower frequency range.

On the other hand, when a channel in the lower frequency range is received, switch 32 will be opened and the circuit will be equivalent to that which is shown in FIG. 4. The tuning capacitance $C_{T2}$ in this state of the AFC circuit can be expressed as follows:

$$C_{T2} = \frac{C_1 \cdot (C_2 + C_3)}{C_1 + C_2 + C_3}. \quad (5)$$

Consider the influence of the variation of the capacitance $C_1$ of the second variable capacitance element 34 on the tuning capacitance $C_{T1}$ and $C_{T2}$ as set forth in the above equations. When the circuit is tuned to the high frequency range, capacitor 42 is connected in parallel with the varactor 34 and hence the effect of a variation in the capacitance $C_1$ on capacitance $C_{T1}$ is comparatively small. On the other hand, the circuit is tuned to the lower frequency range, the second variable capacitance element 34 is connected in series with the capacitances $C_2$ and $C_3$ of capacitors 36 and 42, and thus the effect of variations in the capacitance $C_1$ of the second variable controlled capacitance element is relatively large. As a result, the AFC sensitivity is narrowed during operation in the higher frequency ranges and widened during operation in the lower frequency ranges.

It should be appreciated that by merely capacitively coupling the second variable capacitance element to the junction between the inductance coils, the AFC sensitivity can be narrowed in the higher frequency ranges and widened in the lower frequency ranges. Thus, by the addition of a single capacitor, a remarkably advantageous result is achieved, namely, substantially equalizing the AFC sensitivity throughout the entire frequency range.

Figure 5:
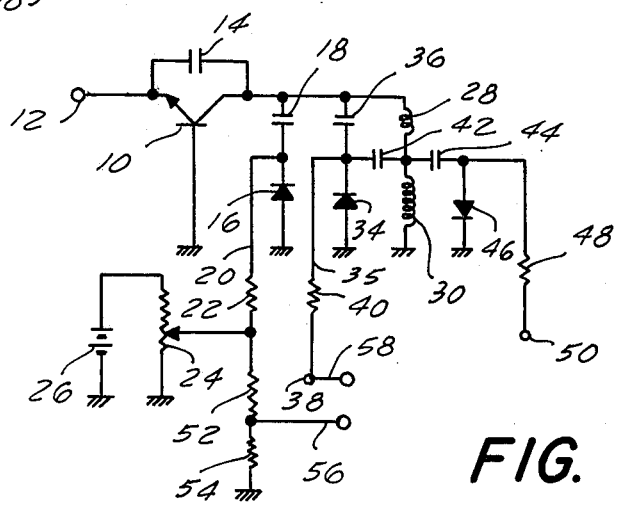
FIG. 5 is a schematic diagram of a second preferred embodiment of the present invention.

FIG. 5 shows a schematic diagram of a second embodiment of the present invention. In this embodiment switch 32 is replaced by a capacitor 44, a diode 46, and a resistor 48. Diode 46 and resistor 48 are connected in parallel. Diode 46 is connected between capacitor 44 and ground, and resistor 48 is connected between capacitor 44 and a node 50 connected to a voltage source. In addition, series connected resistors 52 and 54 are connected between ground and the input from potentiometer 24 to resistor 22. The junction between resistors 52 and 54 is connected by means of connector 56 to the lower potential side of the AFC detecting circuit whereas line 58 connects node 38 to the higher potential side of the AFC detecting circuit. As a result, the AFC voltage is, in the second embodiment, also applied to the first variable capacitance element 16, thereby making the advantageous effect of the present invention more distinct.

While only two embodiments of the present invention have been disclosed herein for purposes of illustration, it is apparent that many variations and modifications may be made thereon. It is intended to cover all of these variations and modifications which fall within the scope of the invention as defined by the following claim:

I claim:

1. In an AFC circuit of a local oscillator or the like of the type having a first variable capacitance element and series connected first and second inductive elements, said inductive elements being connected in parallel with said first variable capacitance element, switch means for short circuiting said second inductive element, a first capacitor, a second variable capacitance element connected in series with said first capacitor, said second variable capacitance element and said first capacitor both being connected in parallel with said series connected inductive elements, the improvement comprising a second capacitor connected between the junction point of said series connected inductive elements and the junction point between said first capacitor and said second variable capacitance element so as to eliminate undesirable variations in the AFC sensitivity as the oscillator is switched between bands.

* * * * *